(12) United States Patent
Plett (10) Patent No.: US 7,589,532 B2
(45) Date of Patent: Sep. 15, 2009

(54) SYSTEM AND METHOD FOR ESTIMATING A STATE VECTOR ASSOCIATED WITH A BATTERY

(75) Inventor: Gregory L. Plett, Colorado Springs, CO (US)

(73) Assignee: LG Chem, Ltd. (KR)

(\*) Notice: Subject to any disclaimer, the term of this patent is extended or adjusted under 35 U.S.C. 154(b) by 616 days.

(21) Appl. No.: 11/209,453

(22) Filed: Aug. 23, 2005

(65) Prior Publication Data

US 2007/0046292 A1   Mar. 1, 2007

(51) Int. Cl.
*G01N 27/416* (2006.01)

(52) U.S. Cl. .................. 324/426; 320/132; 320/155; 324/429; 324/432

(58) Field of Classification Search .................. 324/426, 324/427, 429, 432, 433; 320/132, 149, 155
See application file for complete search history.

(56) References Cited

U.S. PATENT DOCUMENTS

| 5,694,335 | A | * | 12/1997 | Hollenberg | .................. 726/16 |
| 6,329,823 | B2 | * | 12/2001 | Blessing et al. | ............. 324/427 |
| 6,534,954 | B1 | | 3/2003 | Plett | ........................... 320/132 |
| 7,061,246 | B2 | * | 6/2006 | Dougherty et al. | .......... 324/426 |
| 2005/0100786 | A1 | | 5/2005 | Ryu | ........................... 429/322 |
| 2005/0127874 | A1 | | 6/2005 | Lim | ........................... 320/137 |

\* cited by examiner

*Primary Examiner*—Akm E Ullah
*Assistant Examiner*—Arun Williams
(74) *Attorney, Agent, or Firm*—Cantor Colburn LLP (57) ABSTRACT

A system and a method for estimating a state vector associated with a battery are provided. The method includes determining a time interval that the battery has been electrically decoupled from a load circuit. The time interval starts at a first time. The method further includes obtaining a first state vector associated with the battery from a memory. The first state vector is determined prior to the first time. The method further includes calculating a second predicted state vector associated with the battery based on the first state vector and the time interval.

6 Claims, 5 Drawing Sheets

SYSTEM AND METHOD FOR ESTIMATING A STATE VECTOR ASSOCIATED WITH A BATTERY

BACKGROUND OF THE INVENTION

Batteries are used in a wide variety of electronic and electrical devices. It is desirable to be able to estimate the internal state of a battery, including state-of-charge (SOC). The SOC is a value that indicates the present available capacity of the battery that may be used to do work. A battery monitoring system may measure a history of electrical current input to a battery and an output voltage from the battery to provide an estimate of a battery state.

A battery generally discharges over a time interval when it is electrically unloaded and a state of the battery changes during this time interval. A battery monitoring system, however, interrupts its history of measurements and calculations during this time interval. A disadvantage of this system is that it cannot accurately determine the state of the battery at a time when a battery is electrically coupled to a load circuit after it has been electrically decoupled from the load circuit for the time interval.

Thus, the inventor herein has recognized a need for a system and a method for estimating a state vector associated with a battery at a time when a battery is electrically coupled to a load circuit, after it has been electrically decoupled from the load circuit for the time interval.

BRIEF DESCRIPTION OF THE INVENTION

A method for estimating a state vector associated with a battery in accordance with an exemplary embodiment is provided. The method includes determining a time interval that the battery has been electrically decoupled from a load circuit. The time interval starts at a first time. The method further includes obtaining a first state vector associated with the battery from a memory. The first state vector is determined prior to the first time. The method further includes calculating a second predicted state vector associated with the battery based on the first state vector and the time interval. The method further includes measuring a battery voltage output by the battery to obtain a first battery voltage value after the first time interval when the battery is electrically re-coupled to the load circuit. The method further includes estimating a second battery voltage value associated with the battery based on the second predicted state vector. The method further includes calculating a voltage error value based on the first battery voltage value and the second battery voltage value. The method further includes calculating a third estimated state vector associated with the battery based on the second predicted state vector and the voltage error value.

A system for estimating a state vector associated with a battery in accordance with another exemplary embodiment is provided. The system includes a voltage sensor configured to measure a voltage output from the battery. The further includes a computer operably coupled to the voltage sensor. The computer is configured to determine a time interval that the battery has been electrically decoupled from a load circuit. The time interval starts at a first time. The computer is further configured to obtain a first state vector associated with the battery from a memory. The first state vector is determined prior to the first time. The computer is further configured to calculate a second predicted state vector associated with the battery based on the first state vector and the time interval. The computer is further configured to induce the voltage sensor to measure the voltage output from the battery to obtain a first battery voltage value after the first time interval when the battery is electrically coupled to the load circuit. The computer is further configured to estimate a second battery voltage value associated with the battery based on the second predicted state vector. The computer is further configured to calculate a voltage error value based on the first battery voltage value and the second battery voltage value. The computer is further configured to calculate a third estimated state vector associated with the battery based on the second predicted state vector and the voltage error value.

An article of manufacture in accordance with another exemplary embodiment is provided. The article of manufacture includes a computer storage medium having a computer program encoded therein for estimating a state vector associated with a battery. The computer storage medium includes code for determining a time interval that the battery has been electrically decoupled from a load circuit. The time interval starts at a first time. The computer storage medium further includes code for obtaining a first state vector associated with the battery from a memory. The first state vector is determined prior to the first time. The computer storage medium further includes code for calculating a second predicted state vector associated with the battery based on the first state vector and the time interval. The computer storage medium further includes code for measuring a battery voltage output from the battery to obtain a first battery voltage value after the first time interval when the battery is electrically coupled to the load circuit. The computer storage medium further includes code for estimating a second battery voltage value associated with the battery based on the second predicted state vector. The computer storage medium further includes code for calculating a voltage error value based on the first battery voltage value and the second battery voltage value. The computer storage medium further includes code for calculating a third estimated state vector associated with the battery based on the second predicted state vector and the voltage error value.

Other systems and/or methods according to the embodiments will become or are apparent to one with skill in the art upon review of the following drawings and detailed description. It is intended that all such additional systems and methods be within the scope of the present invention, and be protected by the accompanying claims.

DETAILED DESCRIPTION OF THE INVENTION

Figure 1:
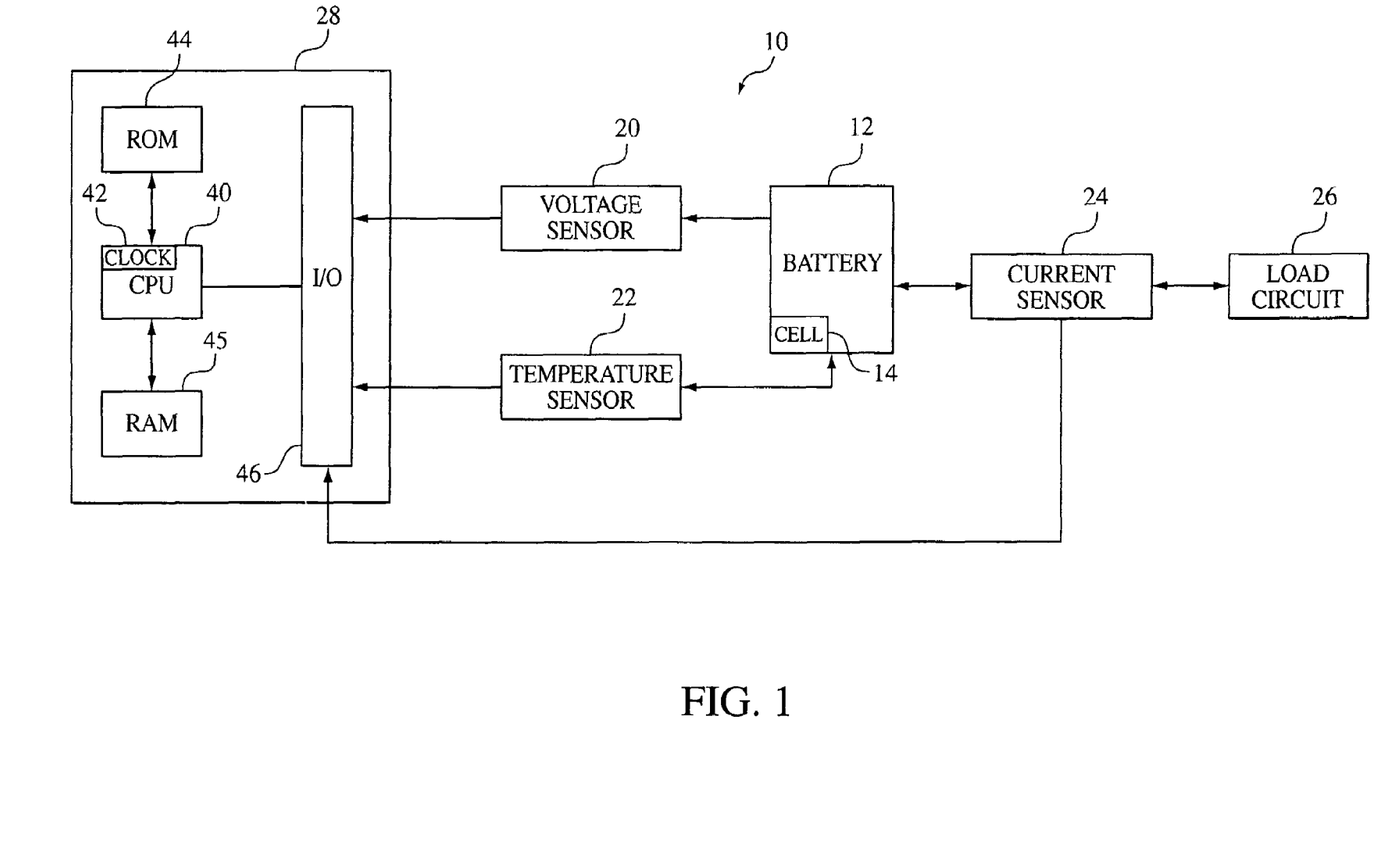
FIG. 1 is a schematic of a system for estimating a state vector associated with a battery in accordance with an exemplary embodiment.

Referring to FIG. 1, a system 10 for estimating a state vector associated with a battery 12 is illustrated. The battery 12 includes at least a battery cell 14. Of course, the battery 12 can include a plurality of additional battery cells. The system 10 includes one or more voltage sensors 20, a load circuit 26, and a computational unit such as a computer 28, and may also include one or more of a temperature sensor 22, and a current sensor 24.

The voltage sensor 20 is provided to generate a first output signal indicative of the voltage produced by one or more of the battery cells of the battery 12. The voltage sensor 20 is electrically coupled between the I/O interface 46 of the computer 28 and the battery 12. The voltage sensor 20 transfers the first output signal to the computer 28. For clarity of presentation, a single voltage sensor will be described herein. However, it should be noted that in an alternate embodiment of system 10 a plurality of voltage sensors (e.g., one voltage sensor per battery cell) are utilized in system 10.

The temperature sensor 22 is provided to generate a second output signal indicative of one or more temperatures of the battery 12. The temperature sensor 22 is disposed proximate the battery 12 and is electrically coupled to the I/O interface 46 of the computer 28. The temperature sensor 22 transfers the second output signal to the computer 28. For clarity of presentation, a single temperature sensor will be described herein. However, it should be noted that in an alternate embodiment of system 10 a plurality of temperature sensors (e.g., one temperature sensor per battery cell) are utilized in system 10.

The current sensor 24 is provided to generate a third output signal indicative of a current sourced or sunk by the battery cells of the battery 12. The current sensor 24 is electrically coupled between the battery 12 and the load circuit 26. The current sensor 24 is further electrically coupled to the I/O interface 46 of the computer 28. The current sensor 24 transfers the third output signal to the computer 28.

The load circuit 26 is electrically coupled to the current sensor 24 and sinks or sources a current from the battery 12. The load circuit 26 comprises any electrical device that can be electrically coupled to the battery 12.

The computer 28 is provided for determining a state vector associated with the battery 12, as will be explained in greater detail below. The computer 28 includes a central processing unit (CPU) 40, a read-only memory (ROM) 44, a volatile memory such as a random access memory (RAM) 45 and an input/output (I/O) interface 46. The CPU 40 operably communicates with the ROM 44, the RAM 45, and the I/O interface 46. The CPU 40 includes a clock 42. The computer readable media including ROM 44 and RAM 46 may be implemented using any of a number of known memory devices such as PROMs, EPROMs, EEPROMS, flash memory or any other electric, magnetic, optical or combination memory device capable of storing data, some of which represent executable instructions used by the CPU 40.

Before providing a detailed discussion of the methodologies for determining a state vector associated with the battery 12, a general overview will be provided. The state vector includes at least a state of charge (SOC) value associated with the battery 12. The SOC value is a value from 0-100 percent, that indicates a present available capacity of the battery 12 that may be used to do work. The estimated state vector is determined when the load circuit 26 is energized utilizing the following parameters: (i) measured battery voltage (ii) a stored prior estimated state vector (including an SOC value); and (iii) a time interval that the load circuit 12 was de-energized or electrically de-coupled from the batter 12. These parameters are utilized in a mathematical model of battery cell behavior in order to compute an improved estimate of the state vector of the battery 12 including possibly compensation for hysteresis effects, voltage polarization effects, and self-discharge. The duration of time that the device was de-energized may be measured using the clock 42 of the computer 28.

It is assumed that a mathematical model of the battery cell dynamics is known, and may be expressed using a discrete-time state-space model comprising a state equation and an output equation, as will be described below.

The state equation utilized to determine the state vector associated with the battery 12 is as follows:

$$x_k = f(x_{k-1}, u_{k-1}, w_{k-1}, k-1, k)$$

wherein, $x_k$ is the state vector associated with the battery 12 at time index k;

$u_k$ is a variable representing a known/deterministic input to the battery 12;

$w_k$ is a process noise or disturbance that models some unmeasured input which affects the state of the system; and $f(x_{k-1}, u_{k-1}, w_{k-1}, k-1, k)$ is a state transition function.

The state vector $x_k$ includes a SOC value therein. Further, the known/deterministic input $u_k$ includes at least one of: (i) an electrical current presently sourced or sunk by the battery 12, and (ii) a temperature of the battery 12.

An output vector associated with the battery 12 is determined utilizing the following equation:

$$y_k = h(x_k, u_k, v_k, k)$$

wherein, $h(x_k, u_k, v_k, k)$ is a measurement function; and $v_k$ is sensor noise that affects the measurement of the output of battery 12 in a memory-less mode, but does not affect the state vector of battery 12.

The following system utilizes probabilistic inference to determine an estimated state vector $\hat{x}_k$ of the state vector $x_k$ given all observations $Y_k = \{y_0, y_1, \ldots, y_k\}$. A frequently used estimator is the conditional mean:

$$\hat{x}_k = E[x_k | Y_k] = \int_{R_{x_k}} x_k p(x_k | Y_k) dx_k$$

where $R_{x_k}$ is the range of $x_k$, and E[ ] is the statistical expectation operator. The foregoing equation computes a posterior probability density $p(x_k | Y_k)$ recursively. Because the foregoing equation is difficult to solve, numerical methods have been utilized to approximate the equation to calculate the estimated state vector $\hat{x}_k$, as will be explained in greater detail below.

For purposes of understanding, the notation utilized in the equations of the following methods will be described. The circumflex symbol indicates an estimated quantity (e.g., $\hat{x}$ indicates an estimate of the true quantity x). The superscript symbol "−" indicates an a priori estimate (i.e., a prediction of a quantity's present value based on past data). The superscript symbol "+" indicates an a posteriori estimate (e.g., $\hat{x}_k^+$ is the estimate of true quantity x at time index k based on all measurements taken up to and including time k). The tilde symbol indicates the error of an estimated quantity (e.g., $\tilde{x}_k^- = x_k - \hat{x}_k^-$ and $\tilde{x}_k^+ = x_k - \hat{x}_k^+$). The symbol $\Sigma_{xy} = E[xy^T]$ indicates the correlation or cross correlation of the variables in its subscript (the quantities described herein are zero-mean, so the correlations are identical to covariances). The symbol $\Sigma_x$ indicates the same quantity as $\Sigma_{xx}$. The superscript "T" is a matrix/vector transpose operator.

Figure 2:
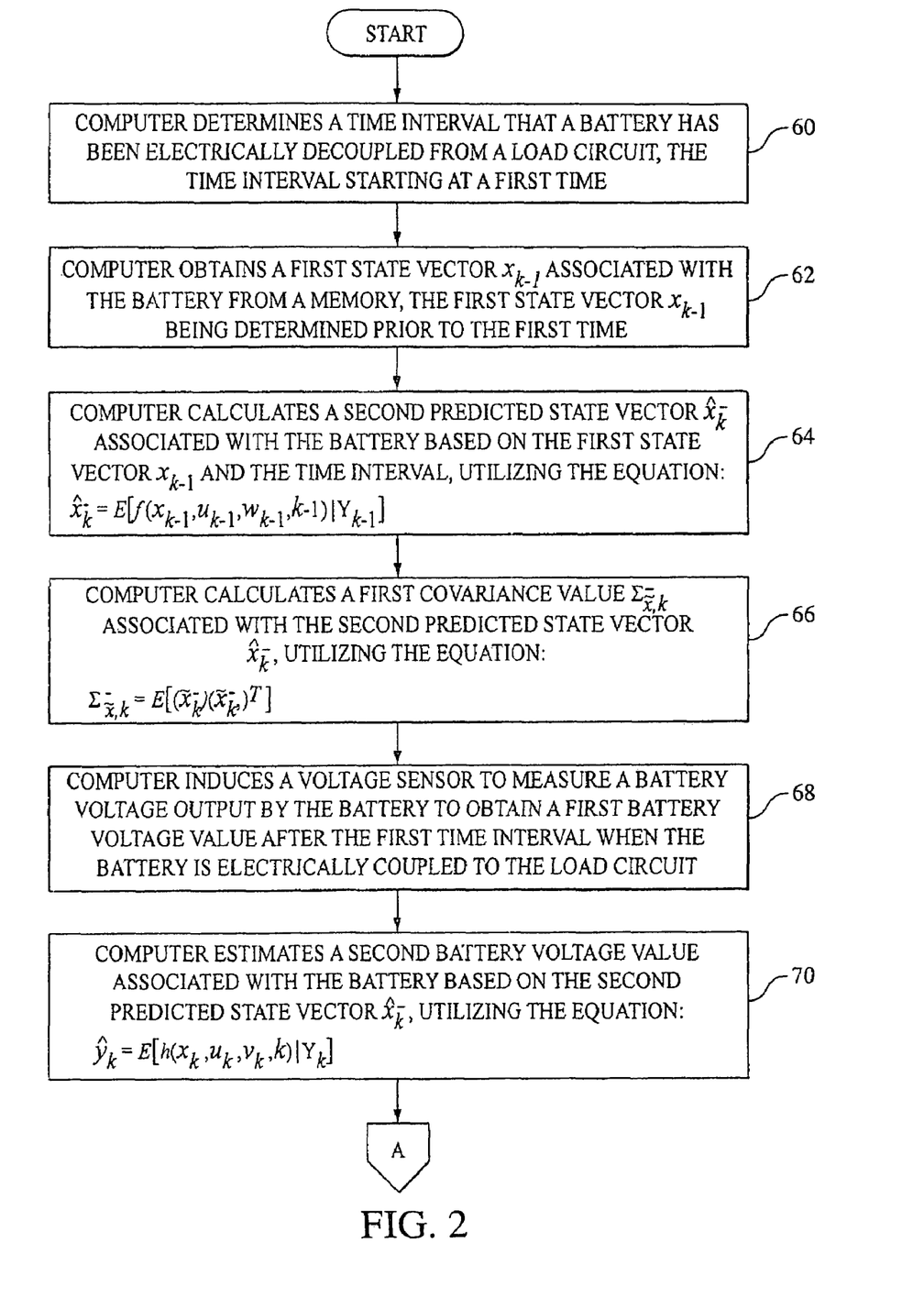
FIGS. 2-3 are flowcharts of a method for estimating a state vector associated with a battery in accordance with another exemplary embodiment.
Figure 3:
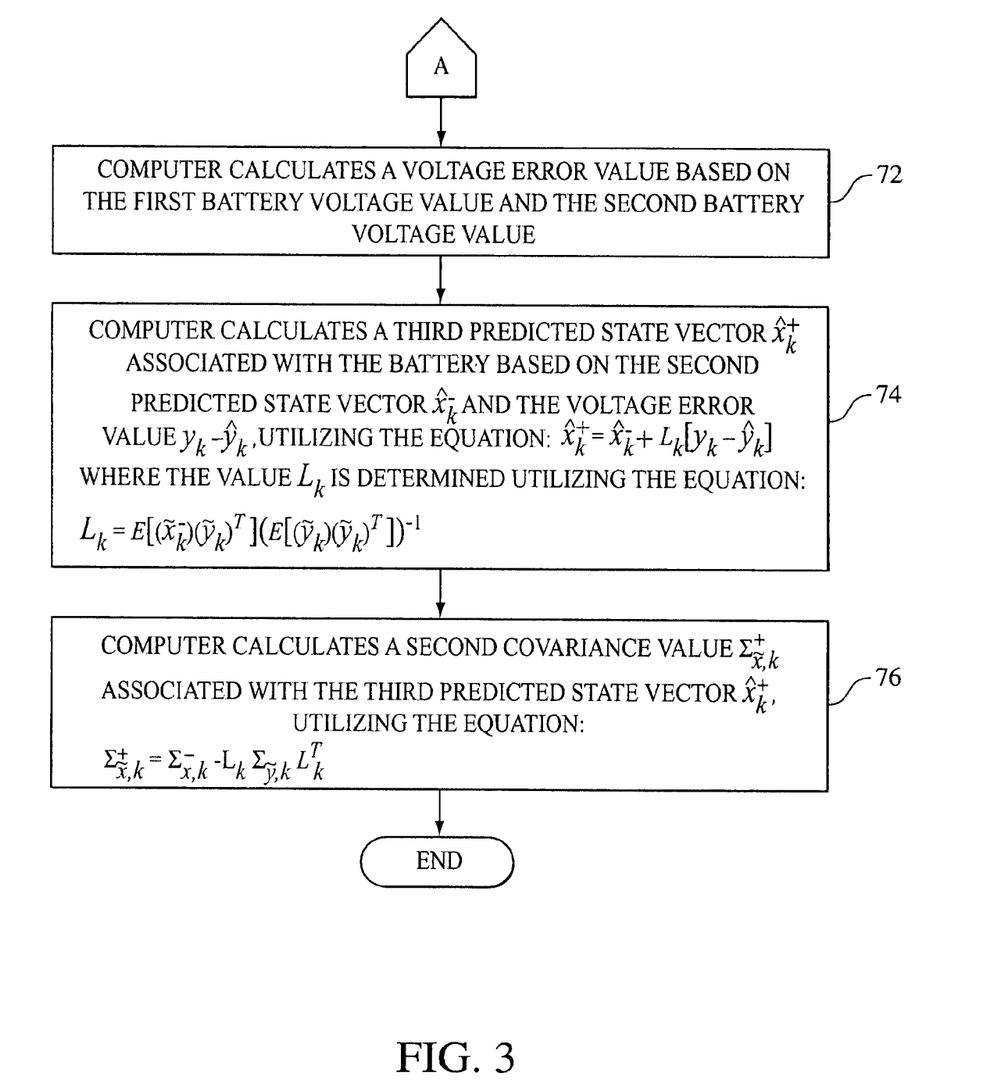

Referring to FIGS. 2-3, a method for calculating the estimated state vector $\hat{x}_k$ utilizing a general sequential probabilistic inference methodology will be explained.

At step 60, the computer 28 determines a time interval that the battery 12 has been electrically decoupled from the load circuit 26. The time interval starts at a first time.

At step 62, the computer 28 obtains a first state vector $x_{k-1}$ associated with the battery 12 from a memory 46. The first state vector $x_{k-1}$ is determined prior to the first time.

At step 64, the computer 28 calculates a second predicted state vector $\hat{x}_k^-$ associated with the battery 12 based on the first state vector $x_{k-1}$ and the time interval, utilizing the equation: $\hat{x}_k^- = E[f(x_{k-1}, u_{k-1}, w_{k-1}, k-1)|Y_{k-1}]$.

At step 66, the computer 28 calculates a first covariance value $\Sigma_{x,k}^-$ associated with the second predicted state vector $\hat{x}_k^-$, utilizing the equation:

$$\Sigma_{\tilde{x},k}^- = E[(\tilde{x}_k^-)(\tilde{x}_k^-)^T].$$

At step 68, the computer 28 induces a voltage sensor 20 to measure a battery voltage output by the battery 12 to obtain a first battery voltage value after the first time interval when the battery 12 is electrically coupled to the load circuit 26.

At step 70, the computer 28 estimates a second battery voltage value associated with the battery 12 based on the second predicted state vector $\hat{x}_k^-$, utilizing the equation:

$$\hat{y}_k = E[h(x_k, u_k, v_k, k)|Y_k].$$

At step 72, the computer 28 calculates a voltage error value based on the first battery voltage value and the second battery voltage value.

At step 74, the computer 28 calculates a third predicted state vector $\hat{x}_k^+$ associated with the battery 12 based on the second predicted state vector $\hat{x}_k^-$ and the voltage error value $y_k - \hat{y}_k$, utilizing the equation: $\hat{x}_k^+ = \hat{x}_k^- + L_k[y_k - \hat{y}_k]$. where the value $L_k$ is determined utilizing the equation:

$$L_k = E[(\tilde{x}_k^-)(\tilde{y}_k)^T](E[(\tilde{y}_k)(\tilde{y}_k)^T])^{-1}$$

The third predicted state vector $\hat{x}_k^+$ is the most accurate estimate of the true state of the battery 12 produced by the foregoing method.

At step 76, the computer 28 calculates a second covariance value $$\Sigma_{\tilde{x},k}^+$$

associated with the third predicted state vector $\hat{x}_k^+$, utilizing the equation:

$$\Sigma_{\tilde{x},k}^+ = \Sigma_{\tilde{x},k}^- - L_k \Sigma_{\tilde{y},k} L_k^T.$$

After step 76, the method is exited.

It should be noted that there are many methods for approximating the third predicted state vector $\hat{x}_k^+$, described above. For example, one method utilizes a linear Kalman filter, another method utilizes a nonlinear extended Kalman filter, another method utilizes a nonlinear sigma-point Kalman filter. These methods utilize different levels of computational effort and produce different degrees of accuracy in the resulting state vector.

Figure 4:
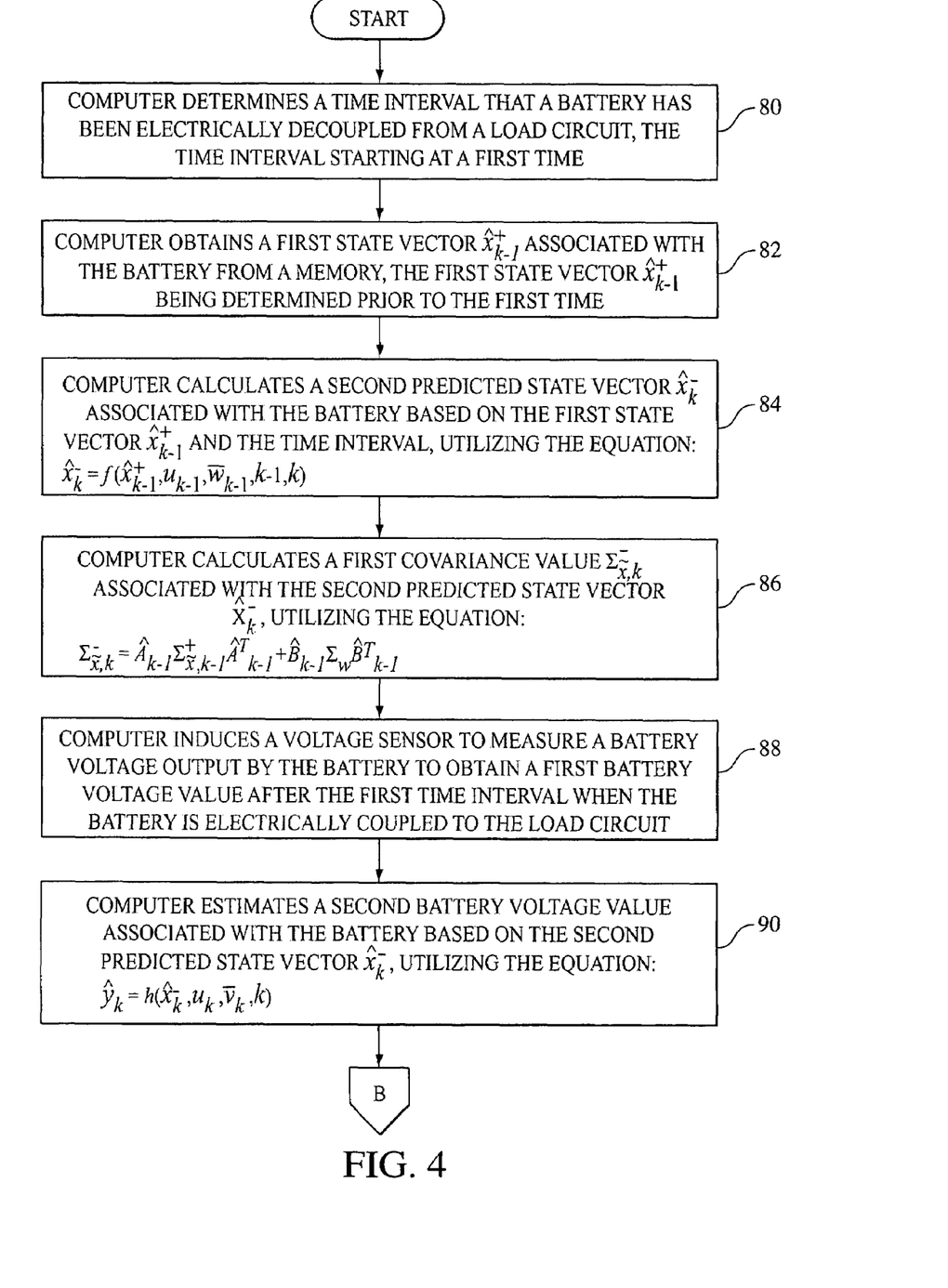
FIGS. 4-5 are flowcharts of a method for estimating a state vector associated with a battery in accordance with another exemplary embodiment.
Figure 5:
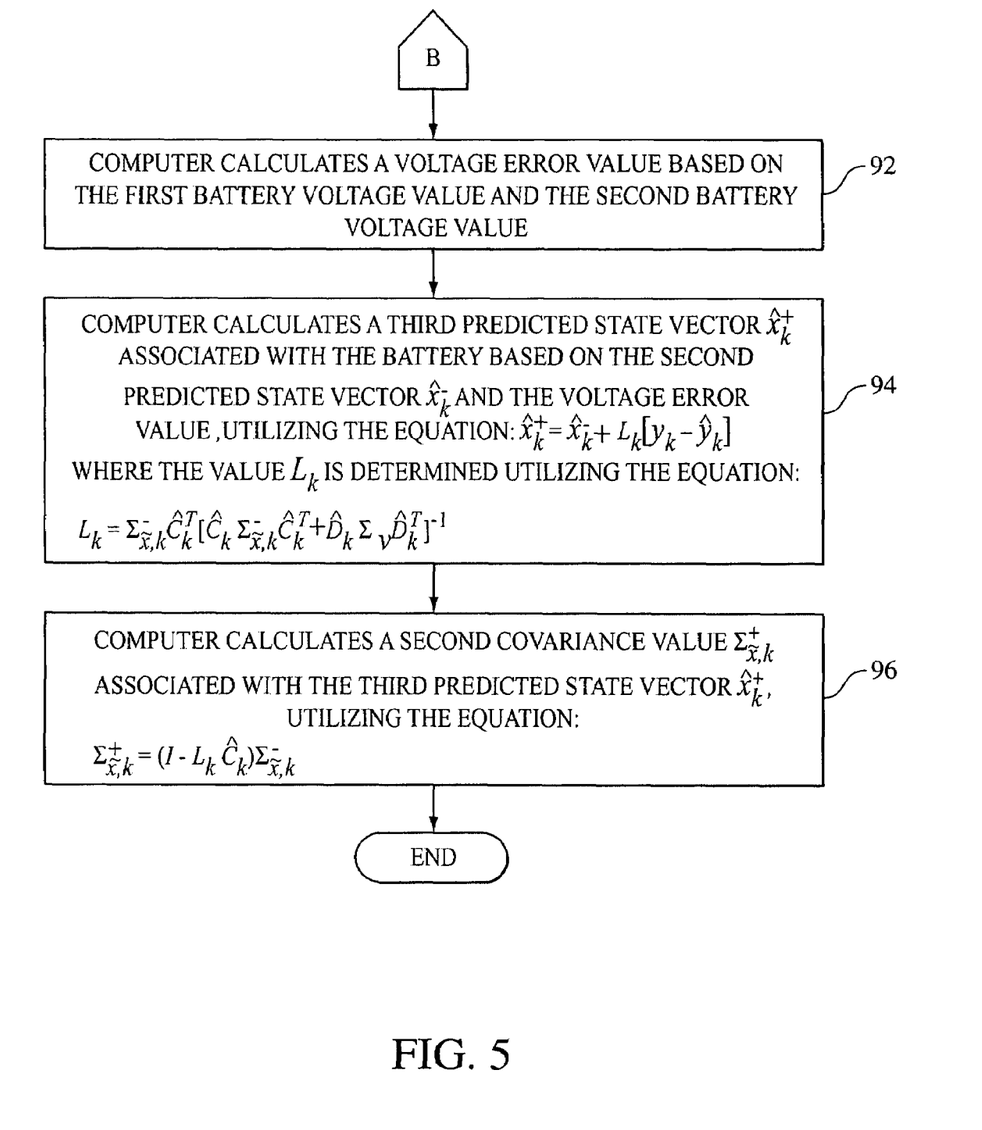

For example, referring to FIGS. 4-5, a method for calculating the estimated state vector $\hat{x}_k$ utilizing a non-linear extended Kalman filter will be explained. The following definitions are utilized in the equations of the method:

$$\hat{A}_k = \frac{\partial f(x_k, u_k, w_k, k)}{\partial x_k}\bigg|_{x_k = \hat{x}_k^+} \quad \hat{B}_k = \frac{\partial f(x_k, u_k, w_k, k)}{\partial w_k}\bigg|_{w_k = \overline{w}_k}$$

$$\hat{C}_k = \frac{\partial h(x_k, u_k, v_k, k)}{\partial x_k}\bigg|_{x_k = \hat{x}_k^-} \quad \hat{D}_k = \frac{\partial h(x_k, u_k, v_k, k)}{\partial v_k}\bigg|_{v_k = \overline{v}_k}$$

At step 80, the computer 28 determines a time interval that a battery 12 has been electrically decoupled from a load circuit 26. The time interval starts at a first time.

At step 82, the computer 28 obtains a first state vector $\hat{x}_{k-1}^+$ associated with the battery 12 from the memory 46. The first state vector $\hat{x}_{k-1}^+$ is determined prior to the first time.

At step 84, the computer 28 calculates a second predicted state vector $\hat{x}_k^-$ associated with the battery 12 based on the first state vector $\hat{x}_{k-1}^+$ and the time interval, utilizing the equation: $\hat{x}_k^- = f(\hat{x}_{k-1}^+, u_{k-1}, \overline{w}_{k-1}, k-1, k)$.

At step 86, the computer 28 calculates a first covariance value $$\Sigma_{\tilde{x},k}^-$$

associated with the second predicted state vector $\hat{x}_k^-$, utilizing the equation:

$$\Sigma_{\tilde{x},k}^- = \hat{A}_{k-1} \Sigma_{\tilde{x},k-1}^+ \hat{A}_{k-1}^T + \hat{B}_{k-1} \Sigma_w \hat{B}_{k-1}^T.$$

At step 88, the computer 28 induces the voltage sensor 20 to measure a battery voltage output by the battery 12 to obtain a first battery voltage value after the first time interval when the battery 12 is electrically coupled to the load circuit 26.

At step 90, the computer 28 estimates a second battery voltage value associated with the battery 12 based on the second predicted state vector $\tilde{x}_k^-$, utilizing the equation:

$$\hat{y}_k = h(\hat{x}_k^-, u_k, \overline{v}_k, k).$$

At step 92, the computer 28 calculates a voltage error value based on the first battery voltage value and the second battery voltage value.

At step 94, the computer 28 calculates a third predicted state vector $\hat{x}_k^+$ associated with the battery 12 based on the second predicted state vector $\hat{x}_k^-$ and the voltage error value, utilizing the equation: $\hat{x}_k^+ = \hat{x}_k^- + L_k[y_k - \hat{y}_k]$. where the value $L_k$ is determined utilizing the equation:

$$L_k = \Sigma_{\tilde{x},k}^- \hat{C}_k^T [\hat{C}_k \Sigma_{\tilde{x},k}^- \hat{C}_k^T + \hat{D}_k \Sigma_v \hat{D}_k^T]^{-1}.$$

At step 96, the computer 28 calculates a second covariance value $$\Sigma_{\tilde{x},k}^+$$

associated with the third predicted state vector $\hat{x}_k^+$, utilizing the equation:

$$\Sigma_{\tilde{x},k}^+ = (I - L_k \hat{C}_k) \Sigma_{\tilde{x},k}^-.$$

After step 96, the method is exited.

It should be noted that in alternate embodiments, the estimated state vector $\hat{x}_k$ of the battery 12 can be calculated utilizing a linear Kalman filter, a nonlinear sigma-point Kalman filter, a square-root linear Kalman filter, a square-root extended Kalman filter, a square-root sigma-point Kalman filter, a particle filter, and the like.

The system and methods for estimating a state vector associated with a battery provide a substantial advantage over other systems and methods. In particular, the system and methods provide a technical effect of accurately estimating a state vector associated with the battery at a time when a battery is electrically coupled to a load circuit, after it has been electrically decoupled from the load circuit for the time interval.

The above-described methods can be embodied in the form of computer program code containing instructions embodied in tangible media, such as floppy diskettes, CD ROMs, hard drives, or any other computer-readable storage medium, wherein, when the computer program code is loaded into and executed by a computer, the computer becomes an apparatus for practicing the invention. The above-described methods can also be embodied in the form of computer program code, for example, whether stored in a storage medium, loaded into and/or executed by a computer, or transmitted over some transmission medium, loaded into and/or executed by a computer, or transmitted over some transmission medium, such as over electrical wiring or cabling, through fiber optics, or via electromagnetic radiation, wherein, when the computer program code is loaded into an executed by a computer, the computer becomes an apparatus for practicing the methods. When implemented on a general-purpose microprocessor, the computer program code segments configure the microprocessor to create specific logic circuits.

While the invention is described with reference to the exemplary embodiments, it will be understood by those skilled in the art that various changes may be made an equivalence may be substituted for elements thereof without departing from the scope of the invention. In addition, many modifications may be made to the teachings of the invention to adapt to a particular situation without departing from the scope thereof. Therefore, is intended that the invention not be limited the embodiment disclosed for carrying out this invention, but that the invention includes all embodiments falling with the scope of the intended claims. Moreover, the use of the term's first, second, etc. does not denote any order of importance, but rather the term's first, second, etc. are used to distinguish one element from another.

What is claimed is:

1. A system for estimating a state vector associated with a battery, the system comprising:
    a voltage sensor configured to measure a voltage output from the battery; and
    a computer operably coupled to the voltage sensor, the computer configured to determine a time interval that the battery has been electrically decoupled from a load circuit, the time interval staffing at a first time;
    the computer further configured to obtain a first state vector associated with the battery from a memory, the first state vector being determined prior to the first time;
    the computer further configured to calculate a second predicted state vector associated with the battery based on the first state vector and the time interval that the battery has been electrically decoupled from the load circuit;
    the computer further configured to induce the voltage sensor to measure the voltage output from the battery to obtain a first battery voltage value after the first time interval when the battery is electrically coupled to the load circuit;
    the computer further configured to estimate a second battery voltage value associated with the battery based on the second predicted state vector;
    the computer further configured to calculate a voltage error value based on the first battery voltage value and the second battery voltage value;
    the computer further configured to calculate a third estimated state vector associated with the battery based on the second predicted state vector and the voltage error value.

2. The system of claim 1, further comprising calculating a covariance value associated with the third estimated state vector.

3. The system of claim 1, wherein the computer is further configured to calculate the second predicted state vector associated with the battery based on the first state vector and the time interval, utilizing at least one of a Kalman filter, an extended Kalman filter, a sigma-point Kalman filter, a square-root Kalman filter, a square-root extended Kalman filter, a square-root sigma-point Kalman filter, and a particle filter.

4. The system of claim 1, wherein the computer is further configured to calculate the third estimated state vector associated with the battery based on the second predicted state vector, the first measured battery voltage, and the second estimated battery voltage, utilizing at least one of a Kalman filter, an extended Kalman filter, a sigma-point Kalman filter, a square-root Kalman filter, a square-root extended Kalman filter, a square-root sigma-point Kalman filter, and a particle filter.

5. The system of claim 1, wherein the second predicted state vector is indicative of at least a predicted state-of-charge of the battery.

6. The system of claim 1, wherein the third estimated state vector is indicative of at least a predicted state-of-charge of the battery.

* * * * *

(12) EX PARTE REEXAMINATION CERTIFICATE (7811th)
United States Patent
Plett (10) Number: US 7,589,532 C1
(45) Certificate Issued: Oct. 12, 2010

(54) SYSTEM AND METHOD FOR ESTIMATING A STATE VECTOR ASSOCIATED WITH A BATTERY

(75) Inventor: Gregory L. Plett, Colorado Springs, CO (US)

(73) Assignee: LG Chem, Ltd., Yeouido-Dong, Yeongdeungpo-Gu, Seoul (KR)

Reexamination Request:
No. 90/010,746, Jan. 14, 2010

Reexamination Certificate for:
Patent No.: 7,589,532
Issued: Sep. 15, 2009
Appl. No.: 11/209,453
Filed: Aug. 23, 2005

(51) Int. Cl.
*G01N 27/416* (2006.01)

(52) U.S. Cl. .................. 324/426; 320/132; 320/155; 324/429; 324/432

(58) Field of Classification Search ................. None
See application file for complete search history.

(56) References Cited

U.S. PATENT DOCUMENTS

| | | |
|---|---|---|
| 6,441,586 B1 | 8/2002 | Tate, Jr. et al. |
| 6,876,175 B2 | 4/2005 | Schoch |
| 6,927,554 B2 | 8/2005 | Tate, Jr. et al. |

*Primary Examiner*—Christopher E Lee (57) ABSTRACT

A system and a method for estimating a state vector associated with a battery are provided. The method includes determining a time interval that the battery has been electrically decoupled from a load circuit. The time interval starts at a first time. The method further includes obtaining a first state vector associated with the battery from a memory. The first state vector is determined prior to the first time. The method further includes calculating a second predicted state vector associated with the battery based on the first state vector and the time interval.

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claim 1 is determined to be patentable as amended.

Claims 2-6 were not reexamined.

1. A system for estimating a state vector associated with a battery, the system comprising:
   a voltage sensor configured to measure a voltage output from the battery; and
   a computer operably coupled to the voltage sensor, the computer configured to determine a time interval that the battery has been electrically decoupled from a load circuit, the time interval [staffing] *starting* at a first time;
   the computer further configured to obtain a first state vector associated with the battery from a memory, the first state vector determined prior to the first time;
   the computer further configured to calculate a second predicted state vector associated with the battery based on the first state vector and the time interval that the battery has been electrically decoupled from the load circuit;
   the computer further configured to induce the voltage sensor to measure the voltage output from the battery to obtain a first battery voltage value after the first time interval when the battery is electrically coupled to the load circuit;
   the computer further configured to estimate a second battery voltage value associated with the battery based on the second predicted state vector;
   the computer further configured to calculate a voltage error value based on the first battery voltage value and the second battery voltage value;
   the computer further configured to calculate a third estimated state vector associated with the battery based on the second predicted state vector and the voltage error value.

* * * * *